(12) United States Patent
Kang et al.

(10) Patent No.: US 8,735,265 B2
(45) Date of Patent: May 27, 2014

(54) METHODS OF SELECTIVELY FORMING SILICON-ON-INSULATOR STRUCTURES USING SELECTIVE EXPITAXIAL GROWTH PROCESS

(75) Inventors: Pil-Kyu Kang, Anyang-si (KR); Dae-Lok Bae, Seoul (KR); Gil-Heyun Choi, Seoul (KR); Jong-Myeong Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 290 days.

(21) Appl. No.: 13/082,861

(22) Filed: Apr. 8, 2011

(65) Prior Publication Data
US 2011/0250738 A1    Oct. 13, 2011

(30) Foreign Application Priority Data
Apr. 9, 2010  (KR) .................. 10-2010-0032863

(51) Int. Cl.
*H01L 21/20* (2006.01)

(52) U.S. Cl.
USPC ........................... 438/481; 216/41; 427/163.2

(58) Field of Classification Search
USPC ........................... 438/481; 216/41; 427/163.2
See application file for complete search history.

(56) References Cited

U.S. PATENT DOCUMENTS

| 2005/0116290 | A1  | 6/2005 | deSouza et al. |
| 2007/0190745 | A1* | 8/2007 | Sadaka et al. .................. 438/455 |
| 2009/0155979 | A1* | 6/2009 | Son et al. ........................ 438/430 |
| 2009/0191673 | A1* | 7/2009 | Noguchi et al. ............... 438/166 |
| 2010/0041214 | A1* | 2/2010 | Cho et al. ....................... 438/481 |
| 2011/0049534 | A1* | 3/2011 | Son et al. ......................... 257/77 |

FOREIGN PATENT DOCUMENTS

| KR | 10-1995-0012578 | 5/1995 |
| KR | 1020040085310 A | 10/2004 |

* cited by examiner

*Primary Examiner* — Charles Garber
*Assistant Examiner* — Stanetta Isaac
(74) *Attorney, Agent, or Firm* — Myers Bigel Sibley & Sajovec, P.A.

(57) ABSTRACT

A method of forming a silicon based optical waveguide can include forming a silicon-on-insulator structure including a non-crystalline silicon portion and a single crystalline silicon portion of an active silicon layer in the structure. The non-crystalline silicon portion can be replaced with an amorphous silicon portion and maintaining the single crystalline silicon portion and the amorphous portion can be crystallized using the single crystalline silicon portion as a seed to form a laterally grown single crystalline silicon portion including the amorphous and single crystalline silicon portions.

8 Claims, 6 Drawing Sheets

METHODS OF SELECTIVELY FORMING SILICON-ON-INSULATOR STRUCTURES USING SELECTIVE EXPITAXIAL GROWTH PROCESS

CROSS-REFERENCE TO RELATED APPLICATION

This application claims the benefit of Korean Patent Application No. 10-2010-0032863, filed Apr. 9, 2010, the contents of which are incorporated herein by reference.

BACKGROUND

1. Field

Embodiments according to the inventive concept relate to the field of semiconductors and particularly to methods of forming silicon-on-insulator (SOI) structures on bulk silicon.

2. Description of Related Art

An SOI substrate can include an insulating layer and a single crystalline silicon layer thereon, which occupy the overall area of the substrate. This type of SOI substrate can be more expensive than using a bulk silicon wafer in some applications, such as, the manufacture of optical devices. Various methods of forming SOI layers of different sizes in required regions of a bulk silicon wafer have been proposed.

SUMMARY

In some embodiments according to the inventive concept, a method of forming a silicon based optical waveguide includes forming a silicon-on-insulator structure including a non-crystalline silicon portion and a single crystalline silicon portion of an active silicon layer in the structure. The non-crystalline silicon portion can be replaced with an amorphous silicon portion and maintaining the single crystalline silicon portion and the amorphous portion can be crystallized using the single crystalline silicon portion as a seed to form a laterally grown single crystalline silicon portion including the amorphous and single crystalline silicon portions.

In some embodiments according to the inventive concept, a method of manufacturing a semiconductor device can include preparing a substrate with an insulating layer bounded by a bulk layer at lower and lateral portions thereof and bounded by an active layer thereon at an upper portion thereof, where the active layer includes a first amorphous silicon layer. A primary annealing can be performed to convert a-Si in the first amorphous silicon layer into single-crystalline Si. Only a portion of the first amorphous silicon layer that is not converted into the single-crystalline Si can be removed after the primary annealing process to provide a removed portion and then forming a second amorphous silicon layer in the removed portion. A secondary annealing process can be performed to convert a-Si in the second amorphous silicon layer into single-crystalline Si.

In some embodiments according to the inventive concept, a method of manufacturing a semiconductor device can include forming a bulk trench in a bulk layer, forming an insulating layer in a lower region of the bulk trench, forming a first amorphous silicon layer in an upper region of the bulk trench, performing a primary annealing process converting a-Si in the first amorphous silicon layer into single-crystalline Si, implanting ions into a portion where the a-Si is not converted into the single-crystalline Si in the first amorphous silicon layer after the primary annealing process, to convert the portion into a second amorphous silicon layer, and performing a secondary annealing process to convert a-Si in the second amorphous silicon layer into single-crystalline Si.

DETAILED DESCRIPTION OF THE EMBODIMENTS

Figure 1A:
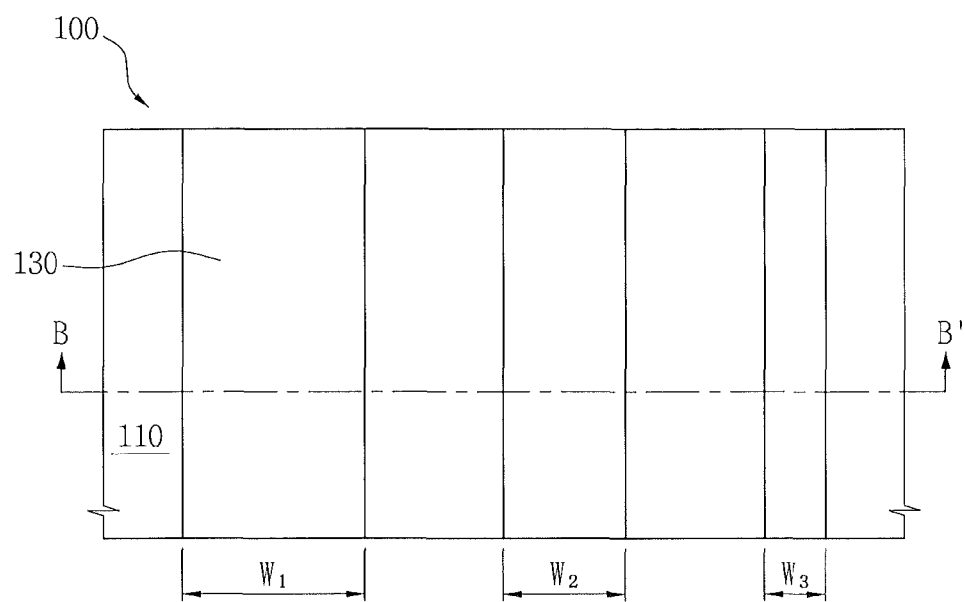
FIG. 1A illustrates a plan view of a semiconductor device in some embodiments according to the inventive concept.

Various example embodiments according to the inventive concept will be described more fully hereinafter with reference to the accompanying drawings, in which some example embodiments according to the inventive concept are shown. The present inventive concept may, however, be embodied in many different forms and should not be construed as limited to the example embodiments according to the inventive concept set forth herein. Rather, these example embodiments according to the inventive concept are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments according to the inventive concept only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments according to the inventive concept are described herein with reference to cross-sectional illustrations that are schematic illustrations of idealized example embodiments according to the inventive concept (and intermediate structures). As such, variations from the shapes of the illustrations as a result, for example, of manufacturing techniques and/or tolerances, are to be expected. Thus, example embodiments according to the inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
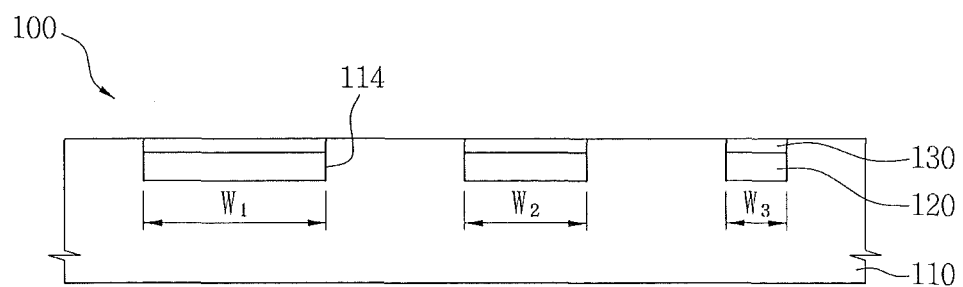
FIG. 1B is a longitudinal cross-sectional view taken along line B-B' of FIG. 1A, which illustrates a semiconductor device having an SOI layer on a bulk silicon wafer in some embodiments according to the inventive concept.

FIG. 1A illustrates a plan view of a semiconductor device according to example embodiments. FIG. 1B is a longitudinal cross-sectional view taken along line B-B' of FIG. 1, which illustrates a semiconductor device having a SOI layer on a bulk silicon wafer according to example embodiments.

Referring to FIGS. 1A and 1B, a semiconductor device 100 may include a bulk layer 110 having a plurality of bulk trenches 114, insulating layers 120 buried in a lower region of each bulk trench 114 and active layers 130 buried in an upper region of each bulk trench 114. The bulk trenches 114, the insulating layers 120 and the active layers 130 may have various widths W1, W2, and W3. Each insulating layer 120 and active layer 130 may constitute a silicon-on-insulator (SOI) structure in which one active layer 130 is stacked on one insulating layer 120.

The bulk layer 110 may be a bulk silicon wafer. The insulating layers 120 may be formed of silicon oxide (SiO2) or silicon oxynitride (SiON). The insulating layers 120 may be formed in a buried oxide (BOX) shape in which the insulating layers 120 are surrounded by the bulk layer 110 and the active layers 130. The active layers 130 may be formed of a semiconductor material such as silicon or silicon germanium. Thus, the active layers 130 may be used as channels of three dimensional transistors or optical waveguides of optoelectronic devices.

The semiconductor device 100 on which the SOI layer is selectively formed in a partial region of bulk silicon wafer may differ from an ordinary SOI substrate on which silicon oxide and single-crystalline Si are formed in an entire region of a wafer. The semiconductor device 100 having the SOI layers with predetermined widths in required regions may be cost-effective compared to the SOI substrate. The SOI layer may be formed to a different size, i.e., a relatively narrow width W3, a double width W2 or a triple width W1 according to the kinds and functions of products.

The bulk layer 110 may be partially recessed and the insulating layers 120 may be formed as a BOX type in recess units and silicon may be deposited on the insulating layers 120, and then removed using a planarization process until a top surface of the bulk layer 110 is exposed so that the top surface of the bulk layer 110 may become at substantially the same level as top surfaces of the active layers 130. Thus, electronic devices, e.g., dynamic random access memories (DRAMs), may be integrated along with the SOI layer on a single bulk silicon wafer at a wafer level. When the electronic device may be manufactured on the bulk silicon wafer, the SOI layer may have no obstructions regardless of a CMP process.

Hereinafter, methods of manufacturing semiconductor devices according to example embodiments will be described.

FIGS. 2 through 11 illustrate methods of manufacturing a semiconductor device according example embodiments.

Figure 2:
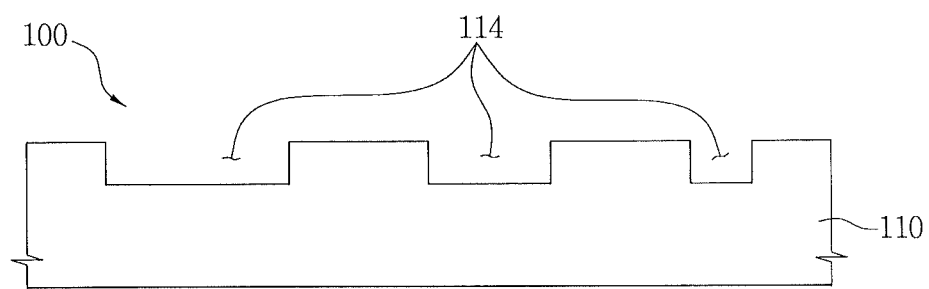
FIGS. 2 through 11 illustrate methods of forming SOI structures in some embodiments according to the inventive concept.

Referring to FIG. 2, a plurality of bulk trenches 114 may be formed in predetermined regions of a bulk layer 110. The bulk trenches 114 may be formed using a recessing process to such a sufficient depth as to bury an insulating layer (see 120 of FIG. 3) and an active layer (see 130 of FIG. 4) to be formed later. The bulk layer 110 may be formed of a semiconductor material, i.e., single-crystalline Si. For example, a bulk silicon wafer may be used as the bulk layer 110.

Figure 3:
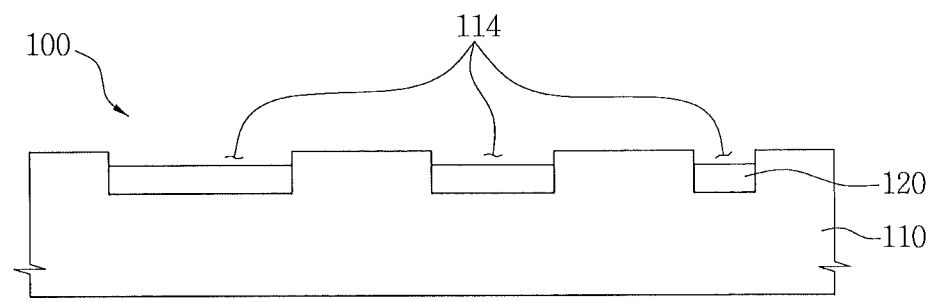

Referring to FIG. 3, an insulating material (not shown) may be formed on the bulk layer 110 to fill the bulk trenches 114. The insulating material may be formed of SiO2 or SiON which has greater insulation characteristics and lower refractive indices than the single-crystalline Si. The insulating material may be deposited using a thermal oxidation process or a chemical vapor deposition (CVD) process.

Thereafter, the insulating material may be partially removed, thereby forming insulating layers 120 to fill a lower region of each of the bulk trenches 114. The insulating layers 120 may be formed using a partial chemical mechanical polishing (CMP) process and/or a partial etchback (E/B) process. The planarization process may be performed until a top surface of the bulk layer 110 is exposed and then top surfaces of the insulating layers 120 are formed at a lower level than that of bulk layer 110. Therefore, space where the active layer (see 130 of FIG. 4) will be buried in a subsequent process later may be provided on the insulating layer 120.

Figure 4:
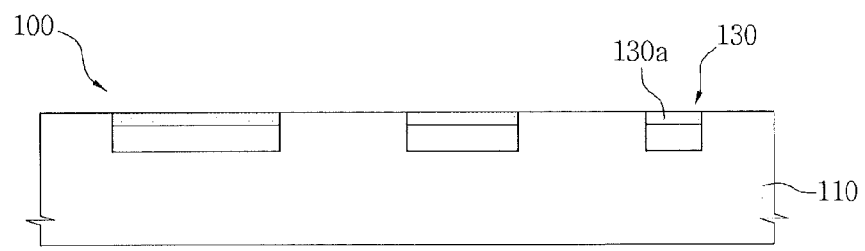

Referring to FIG. 4, amorphous silicon (not shown) may be formed on the bulk layer 110. The amorphous silicon may be deposited at least on the insulating layers 120 using a CVD process. Thereafter, the amorphous silicon may be partially removed, thereby forming the active layers 130 to fill an upper region of each of the bulk trenches 114. The active layers 130 may be formed using a CMP process or an etch-back (E/B) process. The above-mentioned planarization process may be performed until the top surface of the bulk layer 110 is exposed so that top surfaces of active layers 130 are formed at substantially the same level as the top surface of the bulk layer 110. The amorphous silicon (a-Si) is hereinafter referred to as a first amorphous silicon layer 130a.

Since the top surface of the bulk layer 110 is disposed at the same level as the top surfaces of the active layers 130, an additional seed layer for epitaxial growth of a-Si may not be formed in the later process. This is because the bulk layer 110 including single-crystalline Si may function as a seed layer. In particular, since the bulk layer 110 may have the same level as the top surfaces of the active layers 130, re-crystallization of the active layers 130 may be effectively performed in a lateral direction.

Figure 5:
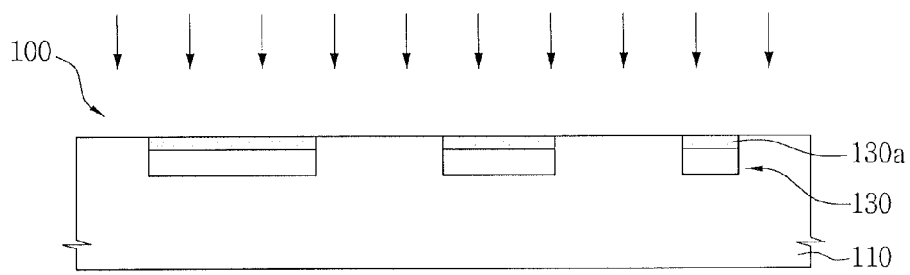

Referring to FIG. 5, a primary annealing process of re-crystallizing a-Si may be performed on the first amorphous silicon layer 130a. The re-crystallization may be performed by an annealing process. When the a-Si is annealed, the a-Si may be converted into single-crystalline Si or poly-crystalline Si. That is, an amorphous state of the active layers 130 may be changed into a crystalline state due to re-crystallization. The annealing process may be performed using a laser annealing process, i.e., an excimer laser processing technique. Even if excimer laser beams are irradiated onto the a-Si only for a brief time, i.e., for several nanoseconds, the laser beams can easily melt a-Si. While the a-Si may be melted using the laser process and then again solidified, the a-Si may be converted to a single-crystalline Si.

For example, when the laser beams are irradiated onto the first amorphous silicon layer 130a, solid-phase a-Si may be melted. The re-crystallization may start from the bulk layer 110 and occur laterally using the single crystalline silicon structure of the bulk layer 110 as a seed layer. Thus re-crystallization of the first amorphous silicon layer 130a may be performed laterally using the bulk layer 110 as a seed layer. Due to the re-crystallization process, the active layer 130 including a first crystalline silicon layer may have the same crystallographic-orientation as the bulk layer 110 containing single-crystalline Si. Thus, the first a-Si layer 130a is crystallized using the bulk layer 110 containing single-crystalline Si as a seed layer so that the active layer 130 having the same crystallographic-orientation as the bulk layer 110 is formed.

Figure 6:
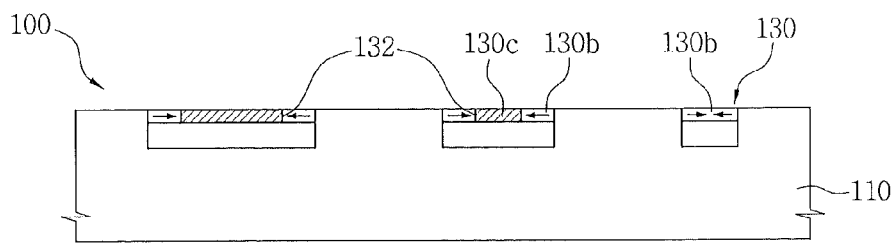

Referring to FIG. 6, the active layer 130 having a relatively wide width may not be sufficiently re-crystallized using a LEG technique in the width direction. For example, a-Si may be crystallized from the seed layer, i.e., single-crystalline Si to a predetermined region of a-Si, i.e., a boundary 132. For example, a-Si in an inside region of the boundary 132 may be converted into single-crystalline Si using the LEG technique, while a-Si in an outside region of the boundary 132 may be converted into a non-crystalline silicon material (e.g., a single-crystalline-like Si or poly-crystalline Si) due to the limitation of LEG.

Meanwhile, when poly-crystalline silicon layers 130c are applied to an optical input/output device, light-scattering may be occur at a grain boundary of the poly-crystalline Si, resulting in generation of optical loss.

Referring to FIG. 7 through FIG. 10, a secondary annealing process may be performed again to re-crystallize the poly-crystalline Si.

Single-crystalline Si is melted at a temperature of about 1450° C. or higher, while poly-crystalline Si is melted at a temperature of about 1400° C. or higher. The melting point of single-crystalline Si is the same as or similar to that of poly-crystalline Si. When laser light is impinged upon the active layers 130 for re-crystallization, single-crystalline Si, as well as poly-crystalline Silicon, can be melted.

Meanwhile, a-Si is melted at a temperature of about 1000° C. or higher. It can be seen that a-Si may be melted at a temperature lower than the melting point of sing-crystalline Si or poly-crystalline Si. When poly-crystalline Si having a melting point similar to that of single-crystalline is replaced by a-Si having a melting point lower than that of single-crystalline, laser beams may be irradiated at a relatively lower temperature. When the laser light is impinged, the a-Si can be heated to a temperature equal to the melting point of a-Si or less, so that the single-crystalline Si may not melt while the a-Si may melts, which can be re-crystallized without having affecting the already formed single-crystalline Si.

Figure 7:
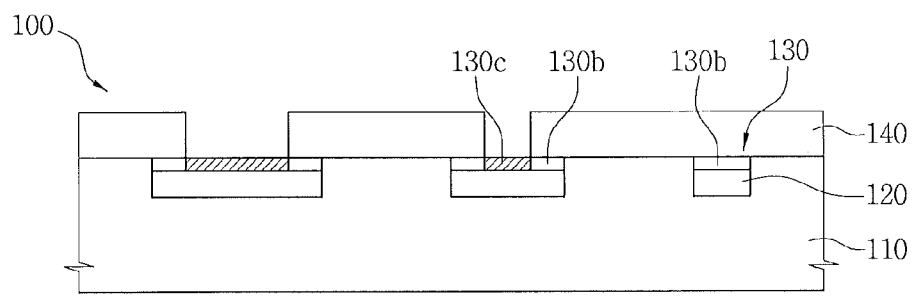

Referring to FIG. 7, a photoresist (not shown) may be formed to a predetermined thickness on the active layers 130. The photoresist may be selectively removed using an exposure and development process to form photoresist patterns 140 exposing poly crystalline silicon layers 130c. The single crystalline silicon layer 130b crystallized already should not be exposed.

Figure 8:
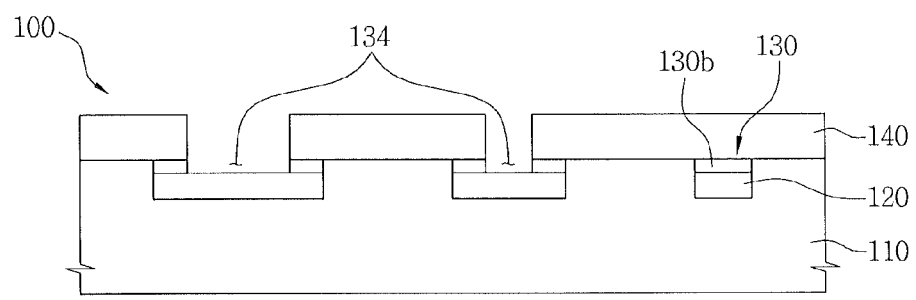

Referring to FIG. 8, the exposed poly crystalline silicon layers 130c may be removed using the photoresist patterns 140 as an etching mask. A dry etching method may be applied to the patterning process. The poly crystalline silicon layers 130c may be removed to form silicon trenches 134 exposing the insulating layers 120. After the etching process, the photoresist patterns 140 may be removed.

Figure 9:
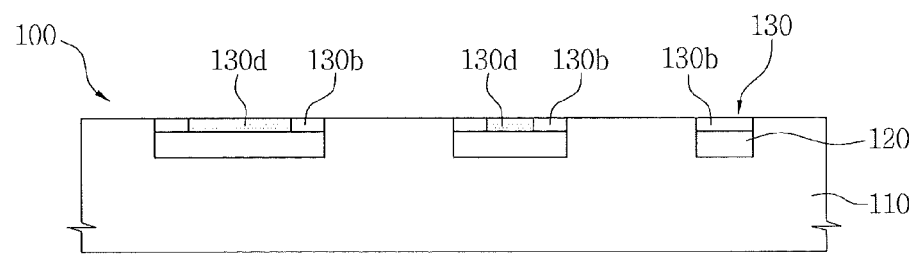

Referring to FIG. 9, a-Si (not shown) may be deposited in the silicon trenches 134 using a blank deposition process. A CVD technique or a physical vapor deposition (PVD) technique may be applied to the deposition process. As stated above, when a silicon material is entirely deposited using a CVD process or a PVD process, the silicon material can be deposited in an amorphous state. A planarization process may be performed until the single crystalline silicon layers 130b is exposed. Thus, second amorphous silicon layers 130d may be formed in the silicon trenches 134.

Figure 10:
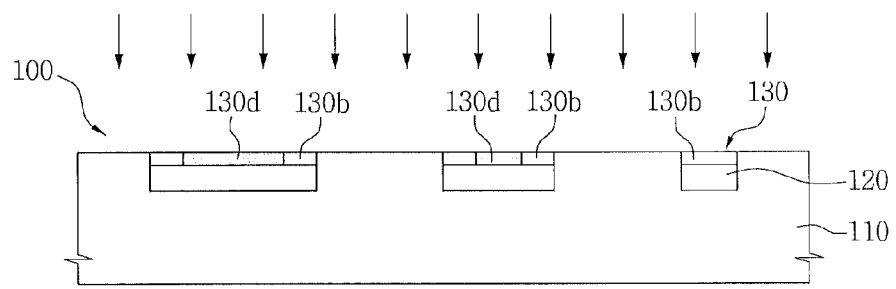

Referring to FIG. 10, a secondary annealing process for re-crystallization may be performed on the second amorphous silicon layers 130d. To this end, laser beams may be irradiated. Even if laser beams are irradiated onto the single crystalline silicon layers 130b, the annealing process may be performed at a temperature of the melting point of a-Si or less so that the single-crystalline Si may not melt.

Figure 11:
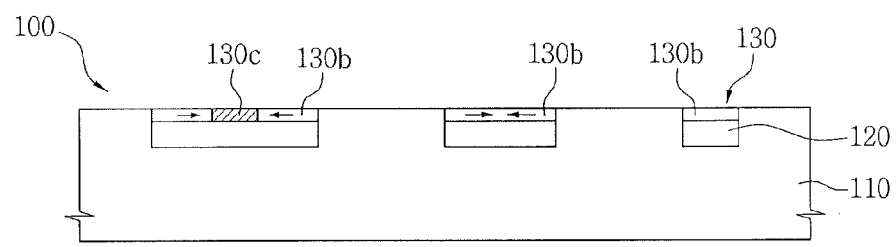

Due to the laser beams, a-Si may laterally re-crystallize. When the re-crystallization is fully carried out as illustrated in FIG. 11 using the laser-induced lateral epitaxial growth process, the re-crystallization processes are no longer required. When the re-crystallization is partially carried out as illustrated in FIG. 11 despite the secondary annealing, it can require an additional re-crystallization process. When the active layer 130 is still in the poly crystalline silicon layer 130c, the above-stated process illustrated in FIGS. 6 through 9 may be repeatedly performed until the active layer 130 is fully converted into the single crystalline silicon layer 130b. For example, when a width (W3) of the active layer 130 is relatively large, the annealing process may be performed more than two times.

Figure 12:
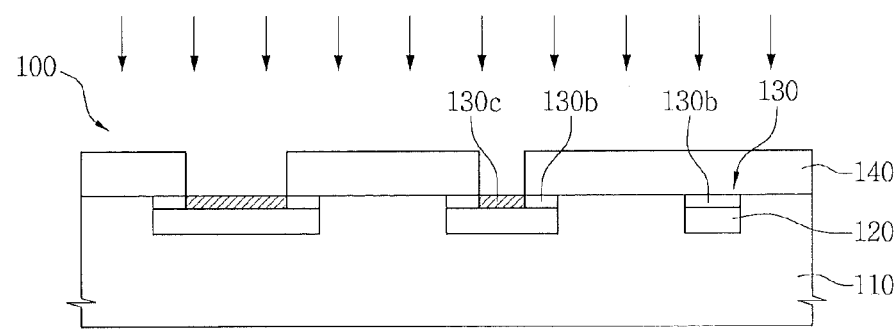
FIG. 12 illustrates methods of forming SOI structures in some embodiments according to the inventive concept.

FIG. 12 illustrates a method of manufacturing a semiconductor device according to various embodiments of the inventive concept.

Referring back to FIG. 7, this example embodiment is the same as the above-described example embodiment, in that a photoresist (not shown) may be formed to a predetermined thickness on the bulk layer 110 and then photoresist patterns 140 may be formed to expose poly crystalline silicon layers 130c.

Referring to FIG. 12, the exposed poly crystalline silicon layer 130c may be doped using the photoresist patterns 140 not as an etching mask but as an ion implantation mask. A pre-amorphization implantation (PAI) process may be performed to convert poly-crystalline Si to a-Si. The PAI process may be carried out using silicon (Si) or germanium (Ge) as a dopant. The dopant is implanted at a sufficient energy and dose as to convert poly-crystalline Si into an amorphous state. Thus, the poly crystalline silicon layers 130c doped with Si or Ge may be converted into an amorphous state.

Referring back to FIG. 9, this example embodiment is the same as the above-described example embodiment, in that due to the PAI process poly-crystalline Si may be converted into a-Si so that the poly crystalline silicon layers 130c may be replaced by second amorphous silicon layers 130d. Referring back to FIG. 10, this example embodiment is the same as the above-described example embodiment, in that a secondary or tertiary annealing process for re-crystallization may be performed on the doped second amorphous silicon layers 130d. As in the previous embodiments of the inventive concept, the re-crystallization may be laterally performed from the single crystalline silicon layers 130b so that the active layer 130 is fully converted into single-crystalline Si.

Figure 13:
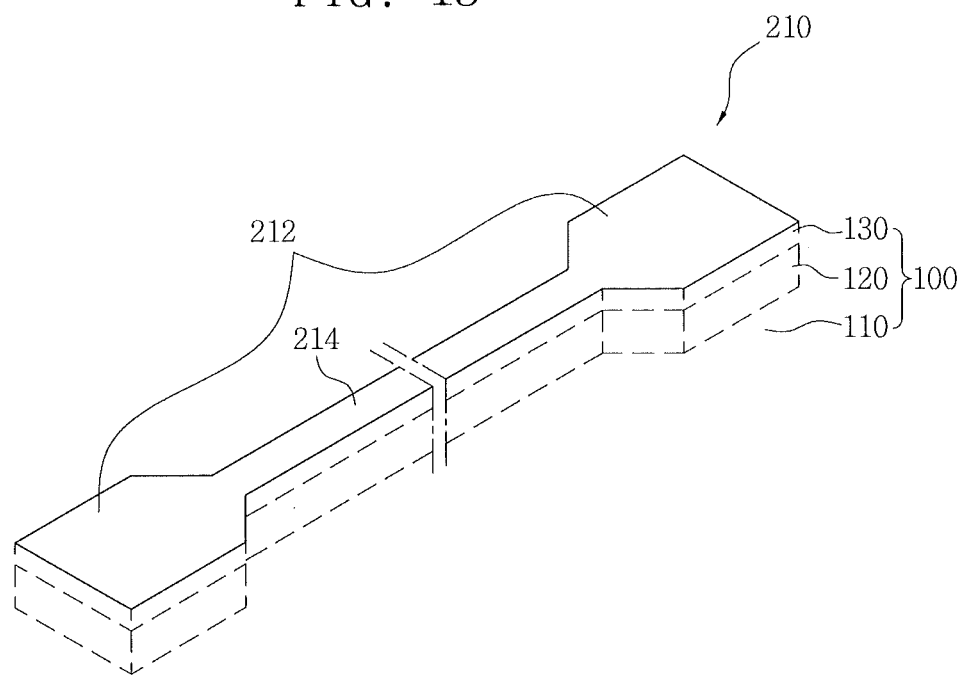
FIG. 13 illustrates a perspective view of an optical input/output device in some embodiments according to the inventive concept.

FIG. 13 illustrates a perspective view of an optical input/output device according to example embodiments.

Referring to FIG. 13, a semiconductor device 100 having a SOI layer on a bulk silicon wafer using a LEG process may be applied to an optical input/output (I/O) device 210. The SOI layer having an insulating layer 120 and an active layer 130 may be formed in a recessed region of a bulk layer 110, so that the optical I/O device 210 may function as an optical waveguide.

Both terminals 212 of the optical I/O device 210 where optical signals are input or output may have a greater width than a waveguide 214 through which the optical signals pass therebetween. Areas of both terminals 212 may be enlarged so that optical signals are easily received or transmitted in both terminals. When a-Si with a wide width is converted into single-crystalline Si using ordinary epitaxial growth techniques, there is a limitation of growth in a lateral width direction. The LEG technique of the present inventive concept is suitable for the wide terminals 212 and for the narrower portions of the optical input/output (I/O) device 210. Thus, there is no limit to re-crystallization of a-Si using a LEG technique, even though a-Si has a relatively greater width.

Figure 14:
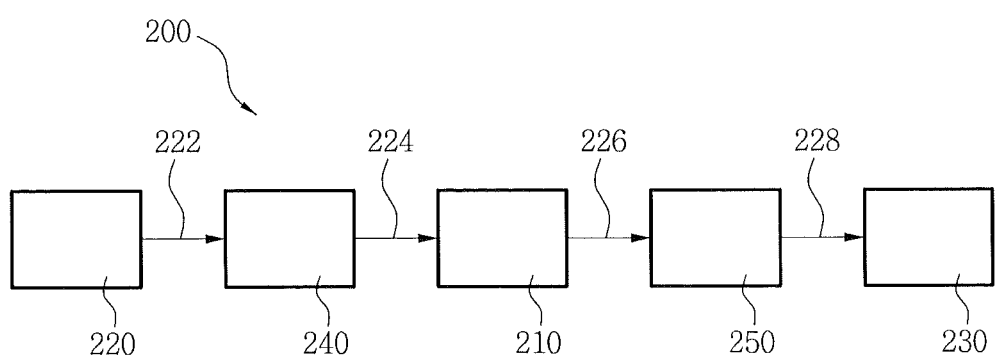
FIG. 14 is a schematic block diagram of an optoelectronic integrated circuit in some embodiments according to the inventive concept.

FIG. 14 is a schematic block diagram of an optoelectronic integrated circuit according to example embodiments.

Referring to FIG. 14, the optical I/O device 210 may be applied to an optoelectronic integrated circuit 200. The optoelectronic integrated circuit 200 may include first and second electronic devices 220 and 230 configured to communicate with one another, a first photoelectric device 240 configured to receive electronic signals from the first electronic device 220 and to generate optical signals, the optical I/O device 210 configured to transmit the optical signals, and a second photoelectric device 250 configured to receive optical signals from the optical I/O device 210 and generate electronic signals. The first electronic device 220 may be a memory device capable of storing various data, while the second electronic device 230 may be a CPU capable of processing the data.

The SOI layer may be formed on the bulk silicon wafer using a LEG process, and the optical I/O device 210 may be manufactured using the SOI layer on the bulk silicon wafer, as mentioned above, so that the optoelectronic integrated circuit 200 including various electronic devices 220 and 230 may be realized on the single bulk silicon wafer.

As described herein, in some embodiments according to the inventive concept, a region where re-crystallization is not sufficiently carried out may be replaced by a-Si, and then the a-Si may be crystallized using an annealing process more than two or three times. Even though the lateral length of the a-Si is long, the a-Si can crystallize over the overall length thereof, thereby overcoming the limitation of LEG.

A region of the a-Si where re-crystallization is not sufficiently carried out may be removed, and then the removed region may be substituted with a-Si having a melting point lower than that of single-crystalline. Thus, since the laser light can heat the material to a temperature that is less than the melting point of single-crystalline Silicon, the amorphous silicon can be melted (and subsequently re-crystallized) while the single-crystalline Silicon remains crystallized.

A region of the a-Si where re-crystallization is not sufficiently carried out may be implanted, and then the implanted region may be converted into a-Si having a melting point lower than that of single-crystalline. Thus, since the laser light can heat the material to a temperature that is less than the melting point of single-crystalline Silicon, the amorphous silicon can be melted (and subsequently re-crystallized) while the single-crystalline Silicon remains crystallized.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A method of manufacturing a semiconductor device, comprising:
   preparing a substrate with an insulating layer bounded by a bulk layer at lower and lateral portions thereof and bounded by an active layer thereon at an upper portion thereof, the active layer including a first amorphous silicon layer;
   performing a primary annealing to convert a-Si in the first amorphous silicon layer into single-crystalline Si;
   removing only a portion of the first amorphous silicon layer that is not converted into the single-crystalline Si after the primary annealing process to provide a removed portion and then forming a second amorphous silicon layer in the removed portion; and
   performing a secondary annealing process to convert a-Si in the second amorphous silicon layer into single-crystalline Si.

2. The method of claim 1, wherein preparing the substrate comprises:
   forming a bulk trench in a predetermined region of the bulk layer using a recessing process;
   forming the insulating layer buried in a lower region of the bulk trench; and
   forming the first amorphous silicon layer buried in an upper region of the bulk trench.

3. The method of claim 2, wherein forming the insulating layer comprises:
   depositing a silicon oxide on the bulk layer using a thermal oxidation process or a chemical vapor deposition (CVD) process; and
   partially removing the silicon oxide using a chemical mechanical polishing (CMP) process or an etchback (E/B) process until a top surface of the silicon oxide is recessed inside the bulk trench.

4. The method of claim 3, wherein forming the active layer comprises:
   depositing silicon on the insulating layer using a physical vapor deposition (PVD) or CVD process; and
   partially removing the silicon using a CMP process or an E/B process until a top surface of the silicon is coplanar with an upper surface of the bulk layer.

5. The method of claim 1, wherein the primary or secondary annealing process is performed using laser light to heat the a-Si to a melting temperature thereof that is less than a melting temperature of single-crystalline Silicon.

6. The method of claim 5, wherein re-crystallization of the a-Si occurs laterally using the bulk layer as a seed layer, wherein less than entire portion of the a-Si is converted to single-crystalline silicon.

7. The method of claim 1, wherein forming the second amorphous silicon layer comprises:
   forming a photoresist pattern exposing a first amorphous silicon portion that is unconverted to single-crystalline silicon after the primary annealing process;
   removing the first amorphous silicon portion using the photoresist pattern as an etching mask to form a silicon trench exposing the insulating layer;
   stripping the photoresist pattern; and
   forming the second amorphous silicon layer in the silicon trench.

8. The method of claim 7, wherein forming the second amorphous silicon layer comprises:
   depositing a-Si on the bulk layer using a PVD process or a CVD process to fill at least the silicon trench; and
   removing the a-Si using a planarization process.

\* \* \* \* \*